(12) United States Patent
Samejima et al.

(10) Patent No.: US 12,253,834 B2
(45) Date of Patent: Mar. 18, 2025

(54) INFORMATION PROCESSING DEVICE, DETERMINATION METHOD, MOLDING DEFECT INSPECTION DEVICE, MOLDING DEVICE, AND METHOD FOR MANUFACTURING PRODUCT

(71) Applicant: CANON KABUSHIKI KAISHA, Tokyo (JP)

(72) Inventors: Yuki Samejima, Tokyo (JP); Akihiko Kawamura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 237 days.

(21) Appl. No.: 17/371,547

(22) Filed: Jul. 9, 2021

(65) Prior Publication Data
US 2022/0019180 A1    Jan. 20, 2022

(30) Foreign Application Priority Data
Jul. 15, 2020    (JP) .................................. 2020-121136

(51) Int. Cl.
  *G05B 13/02*    (2006.01)
  *G03F 7/00*    (2006.01)
(52) U.S. Cl.
  CPC ....... *G05B 13/0265* (2013.01); *G03F 7/0002* (2013.01)
(58) Field of Classification Search
  CPC .......................... G05B 13/0265; G03F 7/0002
  See application file for complete search history.

(56) References Cited

U.S. PATENT DOCUMENTS

| | | | | |
|---|---|---|---|---|
| 2007/0246850 A1* | 10/2007 | Schumaker | ............ | B82Y 40/00 264/443 |
| 2017/0043511 A1* | 2/2017 | Sato | ........................ | B29C 43/58 |
| 2022/0036531 A1* | 2/2022 | Shah | ........................ | G06T 7/60 |

FOREIGN PATENT DOCUMENTS

| | | | | | |
|---|---|---|---|---|---|
| CN | 110969598 A | * | 4/2020 | ........ | G01N 21/8851 |
| JP | 2017126498 A | * | 7/2017 | | |
| JP | 2019080047 A | | 5/2019 | | |
| KR | 20200047169 A | * | 5/2020 | ............. | G01B 11/25 |
| WO | WO-2019219826 A1 | * | 11/2019 | ............... | G03F 1/84 |

* cited by examiner

*Primary Examiner* — Chad G Erdman
(74) *Attorney, Agent, or Firm* — ROSSI, KIMMS & McDOWELL LLP

(57) ABSTRACT

There is provided an information processing device determining necessity/non-necessity of adjustment of conditions for inspecting molding defects of a molded composition on a substrate the information processing device including: an image acquiring unit configured to acquire an image of the molded composition; an inspection unit configured to perform inspection of the molding defects from the image using a machine learning model; an information acquiring unit configured to acquire information relating to a molding defect of the composition on a reference substrate; and a determination unit configured to compare an inspection result acquired by inspecting the molding defects on the reference substrate using the inspection unit with the information relating to a molding defect of the composition that is acquired by the information acquiring unit and determine necessity/non-necessity of the adjustment of the conditions of the inspection based on a result of the comparison.

22 Claims, 17 Drawing Sheets

FIG. 14A

| INSPECTION RESULT 1 | INSPECTION RESULT 2 | MATCHING/ NO-MATCHING |
|---|---|---|
| OK | OK | COINCIDENCE |
| OK | NG | NON-COINCIDENCE |
| NG | OK | NON-COINCIDENCE |

THERE IS FALSE DETECTION OF MOLDING DEFECT.
PLEASE SELECT ADJUSTMENT METHOD.
◉ADJUSTMENT METHOD 1
○ADJUSTMENT METHOD 2
○ADJUSTMENT METHOD 3

[ YES ]   [ NO ]

| MACHINE LEARNING MODEL FOR MOLDING DEFECT INSPECTION | | | | |
|---|---|---|---|---|
| IN USE | MODEL NAME | INSPECTION ACCURACY | LEARNING DATA | LAST USE DATA |
|  | Model_a_YYYYMM | xx % | 20XX/01/03 | 20XX/07/01 |
| * | Model_B_YYYYMM | yy % | 20XX/03/10 | 20XX/10/01 |
|  | Model_C_YYYYMM | zz % | 20XX/05/20 | 20XX/05/30 |

FIG. 14C

THERE IS FALSE DETECTION IN
MOLDING DEFECT INSPECTION.
RE-LEARNING?

[ YES ]   [ NO ]

INFORMATION PROCESSING DEVICE, DETERMINATION METHOD, MOLDING DEFECT INSPECTION DEVICE, MOLDING DEVICE, AND METHOD FOR MANUFACTURING PRODUCT

BACKGROUND OF THE INVENTION

Field of the Invention

The present invention relates to an information processing device, a determination method, an inspection device, a molding device, and a method for manufacturing a product.

Description of the Related Art

As a technology for forming a line pattern on a substrate, a lithography technology using an exposure device that transfers a pattern of an original substrate onto a substrate through a projection optical system is known in recent years, an imprinting technology for forming a fine pattern formed in a mold on a substrate by molding an imprinting material on the substrate using the mold also has gathered attention (see Japanese Patent Laid-Open No. 2019-80047).

In the imprinting technology, a photocuring method is one method for curing imprinting materials. In the photocuring method, a pattern of an imprinting material is formed on a substrate by curing, the imprinting material by emitting light in a state in which the imprinting material supplied to a shot region on the substrate is brought into contact with a mold and separating the mold from the cured imprinting material.

When a pattern is formed on a substrate using the imprinting technology described above, there are cases in which, when the amount of an imprinting material is large, such an imprinting material protrudes to the outside of a shot region thereinafter referred to a "effusion"). On the other hand, when the amount of an imprinting material supplied to a substrate is small, there are cases in which there are places where parts of a pattern are not formed on a shot region (hereinafter referred to as "non-filling"). When effusion occurs, a place at which the imprinting material is excessive becomes defective, and when a pattern is formed in, a shot region on a side on which the imprinting material is excessive, there is a likelihood of the pattern of a mold being damaged in accordance with contact between the excessive imprinting material and the mold. In addition, when non-filling occurs, part of a pattern is not formed on a shot region, and thus there is a likelihood of a semiconductor device being defective.

It is necessary to inhibit occurrence of effusion and non-filling by observing (checking) presence/absence of effusion and non-filling after an imprinting process and adjusting the amount and the position of the imprinting material supplied to the substrate. Here, a place at which effusion or non-filling has occurred is a minute area, and thus a large number of observation images acquired using a microscope having a narrow observation range and a high magnification need to be checked, but it is not realistic for a person to check such a large number of observation images. Thus, a technology for determining a defect of pattern formation and a flattening molding defect (hereinafter referred to as "molding defect") due to effusion or non-filling by inspecting effusion and non-filling from an observation image not through manpower has been requested.

As one example of a unit configured to inspect effusion and non-filling from a large number of observation images, there is a technique using machine learning, Here, in the machine learning, inspection is performed using a computer, and a machine learning model is generated by learning data of observation images acquired in advance using the computer. Next, by inputting an image used for inspection for presence/absence of a formation defect to the machine learning model, an inspection result is acquired. In order to generate to machine learning model used for machine learning, a high cost is necessary for preparation of data for learning, a process for calculating (learning) the machine learning model, acid the like. In a product manufacturing system (a semiconductor manufacturing factory), a plurality of devices are operating, and products of the same kind are manufactured in parallel by a plurality of devices. It is inefficient to calculate a machine learning model for each of such devices. For this reason, by applying a common machine learning model to many devices performing inspection for format on defects, efficient detection of formation defects is realized.

However, when devices used for inspection for formation defects are different from each other, there is a likelihood of accuracy of inspection for formation defects being degraded in accordance with individual differences of the devices or changes with time. There are various factors of degradation of accuracy of inspection for formation defects, and in order to check necessity of adjustment of devices used for inspection for formation defects and specify an adjustment target, visual observation (judgment) of an image and the like are required, and manual operations need to be included. For this reason, it may take time for checking and adjustment operations that are necessary for continuously operating the devices.

SUMMARY OF THE INVENTION

One embodiment of the present invention provides a technology enabling efficient maintenance of determination accuracy in an information processing device determining presence/absence of molding defects of a composition molded on a substrate.

An information processing, device according to one aspect of the present invention is an information processing device determining necessity/non-necessity of adjustment of conditions for inspecting molding defects of a molded composition on a substrate for which a molding process for molding the composition on the substrate is performed using a mold, the information processing device including: an image acquiring unit configured to acquire an image of the molded composition on the substrate; an inspection unit configured to perform inspection of the molding defects of the molded composition from the image acquired by the image acquiring unit using a machine learning model; an information acquiring unit configured to acquire information relating to a molding defect of the composition on a reference substrate that is a substrate for which the molding process has been performed at least in a part and serves as a reference for the determination of necessity/non-necessity, and a determination unit configured to compare an inspection result acquired by inspecting the molding defects of the molded composition on the reference substrate using the inspection unit with the information relating to a molding defect of the composition that is acquired by the information acquiring unit and determine necessity/non-necessity of the adjustment of the conditions of the inspection based on a result of the comparison.

Further features of the present invention will become apparent from the following description of exemplary embodiments with reference to the attached drawings.

BRIEF DESCRIPTION OF THE DRAWINGS

FIGS. 6A and 68 are diagrams illustrating an overview of an auto encoder.

FIGS. 14A to 14C are schematic views illustrating screen examples of a user interface according to the first embodiment.

DESCRIPTION OF THE EMBODIMENTS

Hereinafter, embodiments will be described in detail with reference to the attached drawings. The following embodiments are not for the purpose of limiting an invention relating to the scope of claims. Although a plurality of features are described in the embodiments, the plurality of features are not all essential to the invention, and the plurality of features may be arbitrarily combined. In the attached drawings, the same reference number is assigned to the same component or components similar thereto, and duplicate description will be omitted.

First Embodiment

Figure 1A:
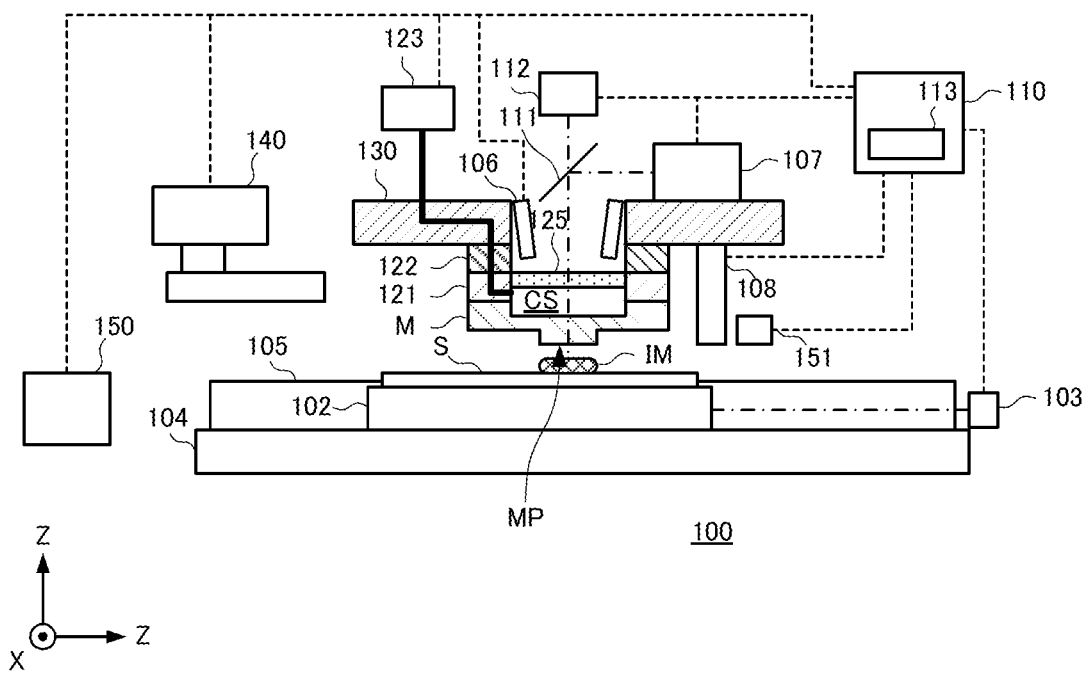
FIGS. 1A and 1B are schematic views illustrating the configuration of an imprinting device as a molding device according to a first embodiment.
Figure 1B:
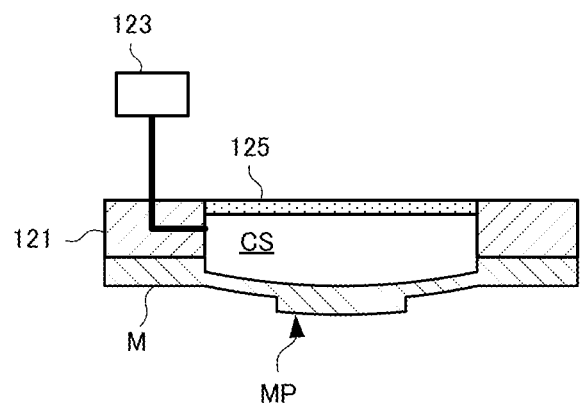

FIGS. 1A and 1B are schematic views illustrating the configuration of an imprinting device 100 as a molding device according to a first embodiment. FIG. 1A is a schematic Vied illustrating the configuration of the imprinting device 100, The imprinting device 100 is a lithography device that performs an imprinting process to form (mold) a pattern of an imprinting material (a composition) on a substrate using a mold (an original plate; a template). The imprinting device 100 cures an imprinting material IM by bringing the uncured imprinting material IM supplied to a substrate and a mold M into contact with each other and applying energy for curing to the imprinting material IM. Then, the cured imprinting material IM and the mold M are separated from each other (mold release). A series of these processes will be referred to as an imprinting process. In accordance with the imprinting process, a pattern is formed on a substrate S. In description presented here, a molding process includes an imprinting process and a flattening process. Here, the flattening process is a process of forming a flattening, layer on a substrate using a mold having a plane part that has no uneven pattern.

As the imprinting material, a curable composition that is cured by applying energy for curing (also referred to as, a resin in an uncured state) is used. As the energy for curing, electromagnetic waves, heat, or the like may be used. For example, the electromagnetic waves may be light having a wavelength that is selected from a range equal to or larger than 10 nm and equal to or smaller than 1 mm, for example, infrared light, visible light, ultraviolet light, or the like. The curable composition may be a composition that is cured in accordance with emission of light or heating. Among such compositions, a light curable composition that is cured in accordance with emission of light contains at least a polymerizable compound and a photopolymerization initiator and may further contain a non-polymerizable compound or a solvent as necessary. The non-polymerizable compound is at least one kind selected from a group consisting of a sensitizer, a hydrogen donor, an internal-additive mold release agent a surfactant, an antioxidant, a polymer component, and the like. The imprinting material is disposed on a substrate in a liquid drop shape, an island shape, or a membrane shape obtained by connecting a plurality of liquid drops. For example, the viscosity of the imprinting material (the viscosity at 25° C.) may be equal to or higher than 1 mPa·s and equal to or lower than 100 mPa·s.

For example, as a material of the substrate, glass, a ceramic, a metal, a semiconductor, a resin, or the like may be used. A member formed from a material different from that of the substrate may be disposed on the surface of the substrate as necessary. For example, the substrate is a silicon wafer, a compound semiconductor wafer, or a crystal glass.

In description presented here and the attached drawings, directions in an XYZ coordinate system having a direction along a substrate holding face of a substrate holding part 102 that holds the substrate S as an XY plane are illustrated. Directions parallel to an X axis, a Y axis, and a Z axis in the XYZ coordinate system will be respectively defined as an X direction, a Y direction, and as L direction, and rotation around the X axis, rotation around the Y axis, and rotation around the Z axis will be respectively defined as θX, θY, and θZ. Control or driving relating to the X axis, the Y axis, and the Z axis represents control or driving relating to a direction parallel to the X axis, a direction parallel to the Y axis, and a direction parallel to the Z axis. In addition, control or driving relating to the θX axis, the θY axis, and the θZ axis respectively represents control or driving relating to rotation around an axis parallel to the X axis, rotation around an axis parallel to the Y axis, and rotation around an axis parallel to the Z axis, A position is information that can be specified on the basis of coordinates of the X axis, the Y axis, and the Z axis, and a posture is information that can be specified by values or the θX axis, the θY axis, and the θZ axis, Positioning represents controlling a position and/or a posture. Position matching may include control of a position and/or a posture of at least one of a substrate and a mold.

The imprinting device 100 may include a substrate holding part 102 that holds a substrate S, a substrate driving mechanism 105 that drives the substrate S by driving the substrate holding part 102, a base 104 that supports the substrate holding part 102, and a position measuring unit 103 that measures the position of the substrate holding pan 102. For example, the substrate driving mechanism 105 may include a motor such as a linear motor.

The imprinting device 100 may include a mold holding part 121 that holds a mold M, mold driving mechanism 122 that drives the mold M by driving the mold holding part 121, and at support structure 130 that supports the mold driving mechanism 122. For example, the mold driving mechanism 122 may include a motor such as a voice coil motor.

The substrate driving mechanism 105 and the mold driving mechanism 122 configure a driving mechanism that adjusts a relative position and a relative posture between the substrate S and the mold M. The adjustment of a relative position between the substrate S and the mold M using the driving mechanism includes driving for a contact of the mold with the imprinting material on the substrate S and separation of the mold from the cured imprinting material (a pattern of a cured material). The substrate driving mechanism 105 may be configured to drive the substrate S with respect to a plurality of axes (for example, three axes including the X axis, the Y axis, and the θZ axis, and more preferably, six axes including the X axis, the Y axis, the Z axis, the θX axis, the θY axis, and the θZ axis). The mold driving mechanism 122 may be configured to drive the mold M with respect to a plurality of axes (for example, three axes including the Z axis, the θX axis, and the θY axis, and more preferably, six axes including the X axis, the Y axis, the Z axis, the θX axis, the θY axis, and the θZ axis).

The imprinting device 100 may include a mold conveying mechanism 140 that conveys the mold M and a mold cleaner 150. For example, the mold conveying mechanism 140 may be configured to convey the mold M to the mold holding part 121 or convey the mold M from the mold holding part 121 to an original plate stoker (not illustrated), the mold cleaner 150, or the like. The mold cleaner 150 cleans the mold M using ultraviolet rays, a chemical, or the like.

The mold holding part 121 may include a window member 125 that forms a pressure control space CS on a rear face (a face on a side opposite to a pattern region MP in which a pattern to be transferred to the substrate S is formed) side of the mold M. FIG. 1B is a schematic view illustrating the configuration of the periphery of the mold M including the pressure control space CS. As schematically illustrated in FIG. 1B, the imprinting device 100 may include a transformation mechanism 123 that transforms the pattern region MP of the mold M into a shape that is convex toward the substrate S by controlling the pressure of the pressure control space CS (hereinafter referred to as a cavity pressure).

In addition, the imprinting device 100 may include an alignment measuring unit 106, a wide angle alignment measuring unit 151, a curing unit 107, an imaging unit 112, and an optical member 111. The alignment measuring unit 106 illuminates an alignment mark of the substrate S and an alignment mark of the mold M and captures an image thereof, thereby measuring a relative position between the marks. The positioning of the alignment measuring unit 106 can be performed by a driving mechanism, which is not illustrated, in accordance with positions of the alignment marks to be observed.

The wide angle alignment measuring unit 151 is a measurement device having a wider visual field than the alignment measuring unit 106 and measures the position of the substrate S by illuminating an alignment mark of the substrate S and capturing an image thereof. By measuring the position of the substrate S using the wide angle alignment measuring unit, the alignment mark of the substrate S can be moved to the inside of the visual field of the alignment measuring unit 106.

The curing unit 107 emits energy for curing the imprinting material IM (for example, light such as ultraviolet light) to the imprinting material IM through the optical member 111 and cures the imprinting material IM in accordance therewith. The imaging unit 112 images the substrate S, the mold M, and the imprinting material IM through the optical member 111 and the window member 125.

The imprinting device 100 may include a dispenser 108 that disposes the imprinting material IM on the substrate S. For example, the dispenser 108 discharges the imprinting material IM such that the imprinting material IM is disposed on the substrate S in accordance with a drop recipe representing the arrangement of the imprinting material IM.

The imprinting device 100 may include a control unit 110 that controls the substrate driving mechanism 105, the mold driving mechanism 122, the transformation mechanism 123, the mold conveying mechanism 140, the mold cleaner 150, the alignment measuring unit 106, the curing unit 107, the imaging unit 112, the dispenser 108, and the like. For example, the control unit 110 may be configured by a programmable logic device (PLD) such as a field programmable gate array (FPGA), an application specific integrated circuit (ASIC), or a general computer it which a program is embedded, or a combination of all or some thereof including a calculation mechanism 113 that is an information processing device.

Figure 2:
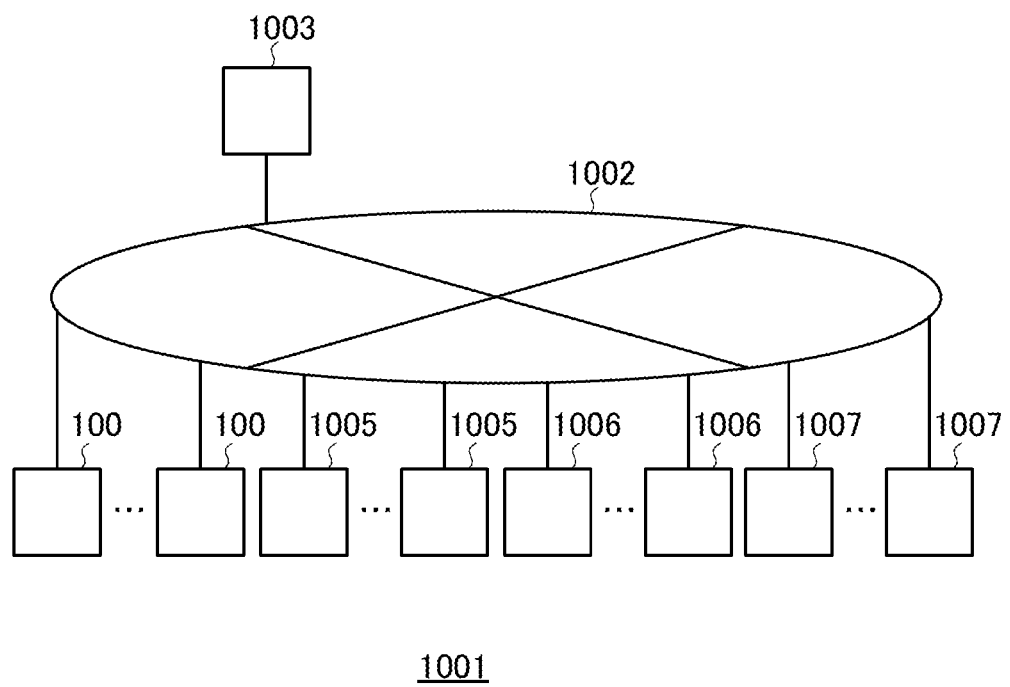
FIG. 2 is a schematic view illustrating the configuration of a lithography system.

FIG. 2 is a schematic view illustrating the configuration of a lithography system 1001 that is used for manufacturing a product such as a semiconductor device. The lithography system 1001 has one or a plurality of imprinting devices 100, one or a plurality of inspection devices 1005, one or a plurality of processing devices 1006, one or a plurality of molding defect inspection devices 1007, and a control device 1003. The lithography system 1001 may further include one or a plurality of exposure devices.

For example, the inspection device 1005 includes an overlap inspection device, a critical dimension (CD) inspection device, as defect inspection device, an electric characteristic inspection device, and the like. For example, the processing device 1006 includes an etching device, a film deposition device, and the like. The imprinting devices 100, the inspection devices 1005, the processing devices 1006, the molding defect inspection devices 1007, and the control device 1003 are interconnected through a network 1002. In the lithography system 1001, the imprinting devices 100, the inspection devices 1005 the processing device 1006, and the molding defect inspection devices 1007 are controlled by a control device 1003 that is an external device different from the imprinting devices 100.

The molding defect inspection device 1007 is configured by embedding a program relating to molding defect inspection into a general or dedicated information processing device (computer). The molding defect inspection device 1007 may, be configured by a PLD such as an FPGA or may be configured by an ASIC. In addition, the molding, defect inspection device 1007 may be realized using the calculation mechanism 113 of the imprinting device 100 and the control device 1003 (together). In other words, the molding defect inspection device may be included in the imprinting device.

The molding defect inspection device 1007 has a function of inspecting presence/absence of a pattern formation defect and a defect in flattening and a function of acquiring accuracy of the inspection and determining necessary/non-necessity of adjustment of the inspection function for the substrate S for which an imprinting process has been performed. A detailed configuration of the molding defect inspection device 1007 will be described below.

An operation of the lithography system 1001 including the imprinting device 100 and the imprinting device 100 will be described with reference to FIG. 3. In this embodiment, after the imprinting process is performed, an image of a peripheral part of a shot region (an area in which a pattern is to be formed) for which the imprinting process has been performed is acquired. Then, effusion angel non-filling (a pattern formation defect and a defect in flattening caused by them (defects in molding a composition)) are inspected (detected) using the acquired image. In this embodiment, in order to inspect effusion and non-filling, machine learning is used. Hereinafter, inspection for effusion and non-filling will be referred to as molding defect inspection. In addition to this, in fins embodiment, separately from the imprinting process and the molding defect inspection, checking of inspection accuracy of molding defect inspection and adjustment of a function relating to molding defect inspection are performed. Hereinafter, checking of inspection accuracy of a device used for a molding defect inspection will be referred to as inspection accuracy checking, and readjustment of a function relating to a molding defect inspection of the device will be referred to as inspection function adjustment. More specifically, by using an inspection result acquired by an inspection unit 1037 of a substrate used as a reference for checking accuracy of a molding defect inspection (a reference substrate) and information relating to molding defects of the reference substrate acquired by an information acquiring unit 1047, the checking of inspection accuracy is performed. In addition, necessity/non-necessity of adjustment of an inspection function is determined on the basis of a result of the checking of the inspection accuracy, and, if adjustment is required, specifying and adjusting of an adjustment target are performed as well. For example, this inspection accuracy checking and the inspection function adjustment are regularly performed.

Figure 3:
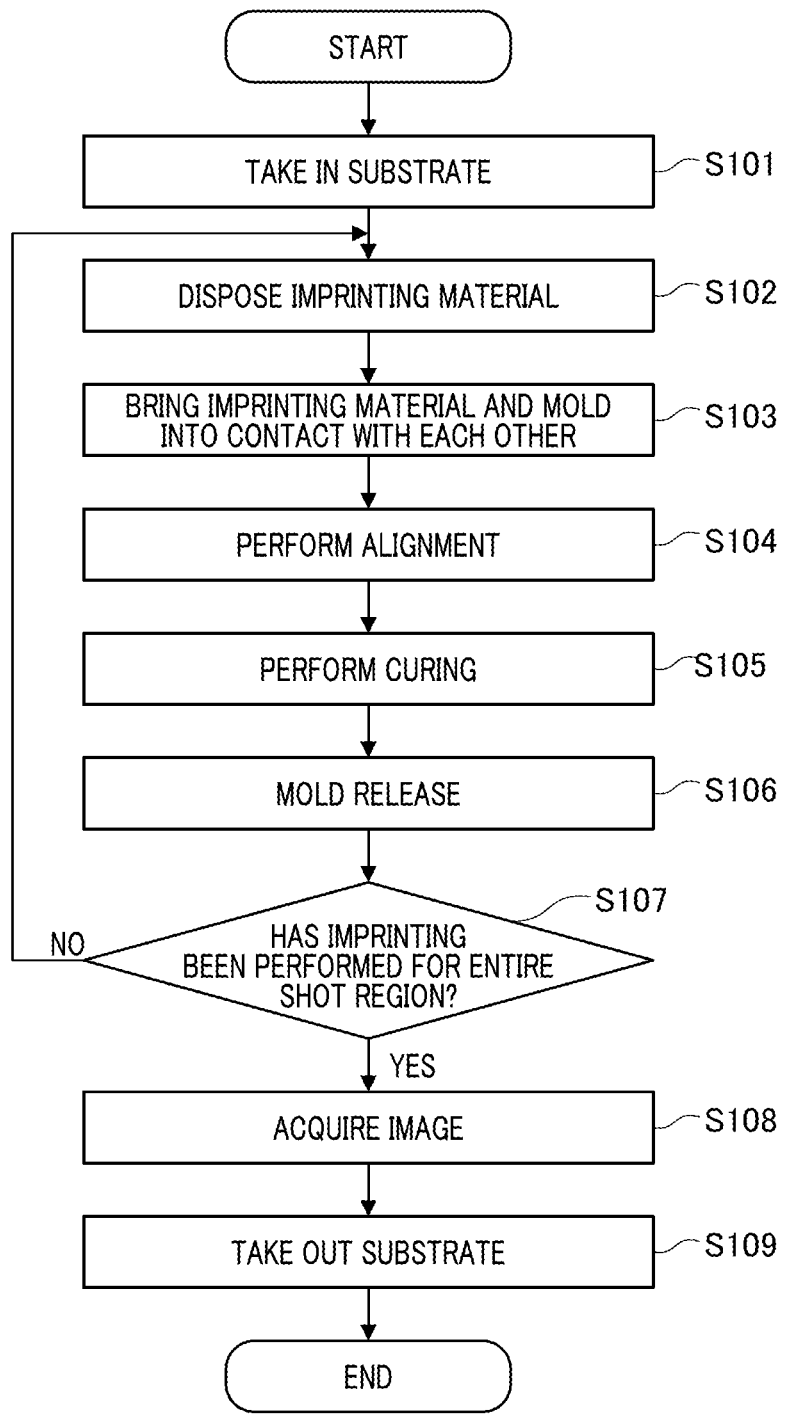
FIG. 3 is a flowchart illustrating an operation of an imprinting device 100.

FIG. 3 is a flowchart illustrating an operation of the imprinting device 100. The operation illustrated in this drawing can be applied also to the lithography system illustrated in FIG. 2. The operation illustrated in FIG. 3 can be controlled by at least one of the control unit 110 and the control device 1003. In Step S101, a substrate S is conveyed by a substrate Conveying mechanism, which is not illustrated, from a conveyance source (for example, a relay unit fix a preprocessing device) to the substrate holding part 102. The position of the conveyed substrate S on the substrate holding part 102 is measured by observing a mark on the substrate S using the wide angle alignment unit 151. Positioning of the substrate S is performed on the basis of the position measured here.

Steps S102 to S106 illustrate steps of the imprinting process for a shot region that is an imprinting target from among a plurality of shot regions of the substrate S.

First, in Step S102, an imprinting material IM is disposed (supplied) on a shot region, which is an imprinting target, from among a plurality of shot regions of the substrate S by the dispenser 108. More specifically, by discharging the imprinting material IM from the dispenser 108 while the substrate S is moved by the substrate driving mechanism 105, the imprinting material IM is disposed in the shot region that is the imprinting target.

In Step S103, the imprinting material IM on the shot region that is the imprinting target and a mold M (a pattern region MP thereof) are brought into contact with each other. More specifically, by relatively n wing the substrate S and the mold M using at least one of the substrate driving mechanism 105 and the mold driving mechanism 122, the imprinting material IM on the shot region that is the imprinting target and the mold M are brought into contact with each other. For example, the mold M is moved by the mold driving mechanism 122 such that the mold M is brought into contact with the imprinting material IM on the shot region that is the imprinting target. When the imprinting material IM on the shot region that is the imprinting target and the mold M are brought into contact with each other, the pattern region MP of the mold M may be transformed into a shape convex toward the substrate S by the transformation mechanism 123.

In Step S104, alignment (positioning) of the substrate S and the mold. M, more specifically, alignment of the shot region that is the imprinting target and the pattern region MP of the mold M is performed. More specifically, alignment is performed such that a relative position between an alignment mark of the shot region that is the imprinting target and an alignment mark of the mold M enters an allowed range of a target relative position while the relative position is measured using the alignment measuring unit 106. For example, by relatively moving the substrate S and the mold M using at least one of the substrate driving mechanism 105 and the mold driving mechanism 122, such a relative position enters an allowed range of the target relative position. For example, the target device position is set in accordance with a correction value determined from past results acquired by the overlap inspection device.

In Step S105, the imprinting material IM is cured in a state in which the imprinting material IM on the shot region that is the imprinting target and the mold M are brought into contact with each other More specifically, energy for curing the imprinting material IM is emitted from the curing unit. 107 to the imprinting material IM between the substrate S and the pattern region MP of the mold M. In accordance with this, the imprinting, material IM is cured, and a cured material (pattern) of the imprinting material IM is formed in the shot region that is the imprinting target.

In Step S106, the mold M is separated from the cured imprinting material IM on the shot region that is the imprinting target (mold release). More specifically, the substrate S and the mold M are relatively moved by at least one of the substrate driving mechanism 105 and the mold driving mechanism 122 such that the cured material of the imprinting material IM and the pattern region MP are separated from each other. For example, the mold M is moved by the mold driving mechanism 122 such that the mold M is separated from the cured material of the imprinting material IM on the shot region that is the imprinting target. When the mold M is separated from the cured imprinting material IM on the shot region that is the imprinting target, the pattern region MP of the mold M may be transformed into a shape convex toward the substrate S by the transformation mechanism 123. In addition, an image is acquired by imaging the substrate S, the mold M, and the imprinting material IM using the imaging unit 112, and a state of separation between the imprinting material IM and the mold M is observed on the basis of such an image.

In Step S107, the control unit. 110 determines whether or not the imprinting process of Steps S102 to S106 has been executed for all the shot regions of the substrate S. Then, if the imprinting process of Steps S102 to S106 has beet executed for all the shot regions of the substrate S, the control unit 110 causes the process to proceed to Step S108. On the other hand, if there are shot regions that have not been processed, the process returns to Step S102. In this case, the imprinting process of Steps S102 to S106 is executed for a selected shot region among shot regions that have not been processed.

In Step S108, the shot regions (and a peripheral part) of the substrate S for which the imprinting process has been performed is imaged, and an image including a pattern in such a shot region is acquired. For example, the wide angle alignment measuring unit 151 may be used for imaging each shot region on the substrate. For a shot region, if the visual field of the wide angle alignment measuring unit 151 is narrow, by perfuming a plurality of number of times of imaging while changing the position of the substrate S using the substrate driving mechanism 105, an image of a desired area (shot regions) may be acquired.

As will be described below, in relation to a process of inspecting (determining) presence/absence of a formation defect of a pattern in the substrate S, the image acquired in Step S108 may be used as an image for learning or may be used as an image for an inspection, in this embodiment, a case in which an image is acquired using the wide angle alignment measuring unit 151 will be described as an example, the configuration is not limited thereto. For example, a similar image may be acquired the alignment measuring unit 106, the imaging unit 112, or the like.

In this embodiment, although an image is acquired by imaging each shot region after performing the imprinting process for all the shot regions on the substrate, the configuration is not limited thereto. For example, after performing the imprinting process for one shot region on the substrate (after S106), an image may be acquired by imaging such shot region. In addition, after the substrate S is taken out from the imprinting device 100 an image may be acquired by imaging each shot region on the substrate using an external device.

The flow illustrated in FIG. 3 illustrates an example of a case in which an imprinting device including a molding defect inspection device is used. If a molding defect inspection is performed by a molding defect inspection device that is separate from the imprinting device, Step S108 is not performed by the imprinting device, and a step similar to Step S108 is performed by the molding defect inspection device. In addition, also if a molding defect inspection is performed by a molding defect inspection device that is separate from the imprint g device, Step S108 is performed by the imprinting device, and a molding defect inspection may be performed by the separate molding defect inspection device using an image captured by the imprinting device.

In Step S109, the substrate S is taken out from the imprinting device 100, More specifically, the substrate S is conveyed from the substrate holding part 102 to a conveyance destination (for example, a relay unit for unit a post-processing device) using a substrate conveying mechanism (not illustrated).

If a lot composed of a plurality of substrates is processed, each step illustrated in FIG. 3 is performed for each of the plurality of substrates.

Next, in this embodiment, an inspection process for inspecting presence/absence of pattern formation defect (a determination method for determining presence/absence of a defect in pattern formation) in a substrate S that is performed after the imprinting process will be described. As described above, a pattern formation defect occurs due to effusion and non-filling.

Figure 4A:
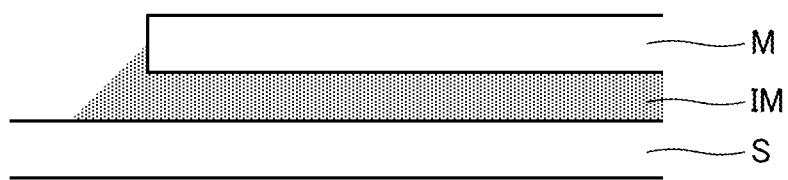
FIGS. 4A and 4B are side views illustrating states in which an imprinting material on a substrate and a mold are brought into contact with each other.
Figure 4B:
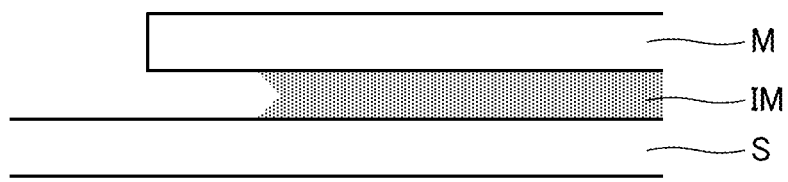

FIGS. 4A and 4B are side views illustrating states in which an imprinting material IM on a substrate and a mold M are brought into contact with each other. For example, this drawing illustrates a state formed in Step S105 described above. FIG. 4A is a diagram illustrating effusion. As illustrated in FIG. 4A, the effusion represents that an imprinting material IM protrudes from a shot region (a mold M) on a substrate (protrusion of the imprinting material IM to the outside of an area in which a pattern is to be formed). FIG. 4B is a diagram illustrating non-filling. As illustrated in FIG. 4B, the non-filling represents that a place, in which the imprinting material IM is not filled between the mold M and the substrate S, is generated.

Figure 5A:
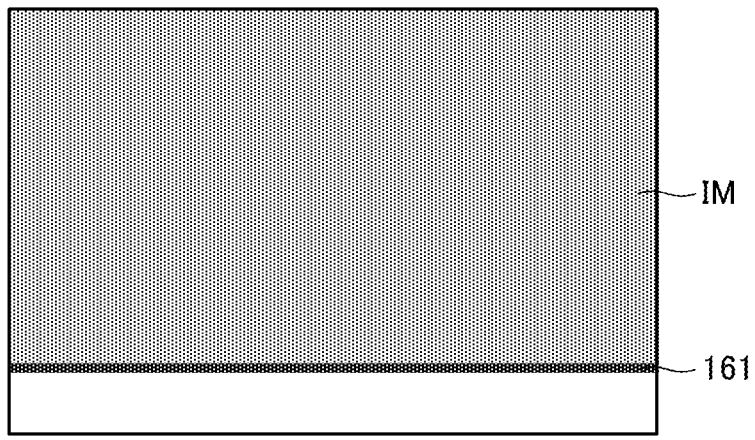
FIGS. 5A to 5C are diagrams illustrating examples of an image acquired in Step S108 illustrated in FIG. 3.
Figure 5B:
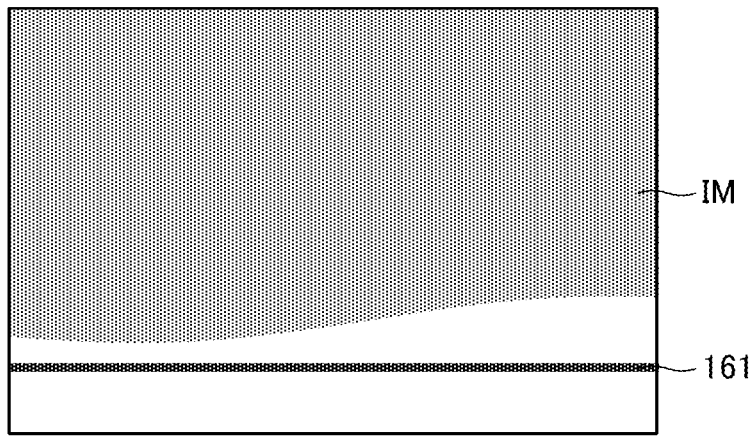
Figure 5C:
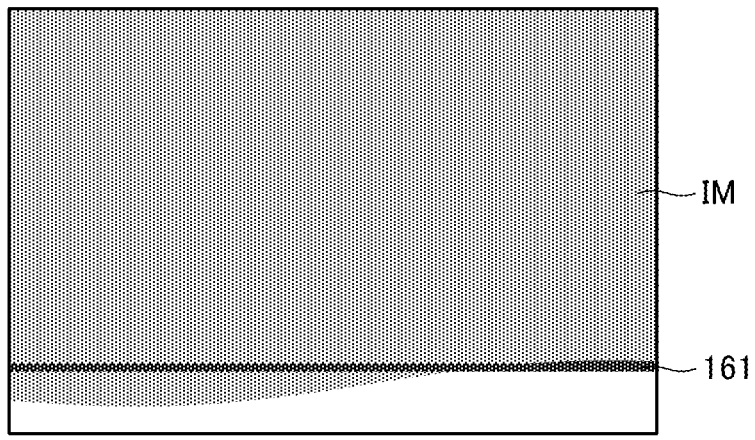

FIGS. 5A to 5C are diagrams illustrating examples of an image acquired in Step S108 illustrated in FIG. 3. FIG. 5A is a diagram illustrating a case in which effusion and non-filling have not occurred. Normally, in other words, if effusion or non-filling has not occurred, as illustrated in FIG. 5A, the imprinting material IM is filled in up to a boundary 161 of the shot region to form a pattern. FIGS. 5A to 5C illustrate examples in which a pattern is formed in a shot region in an upper part of each image. On the other hand, if non-filling has occurred, as illustrated in FIG. 5B, a place in which the imprinting material t is not filled up to the boundary 161 of the shot region is imaged white (or black). In addition, if effusion has occurred, as illustrated in FIG. 5C, the imprinting material IM protruding from the boundary 161 of the shot region is imaged black (or white).

Figure 6A:
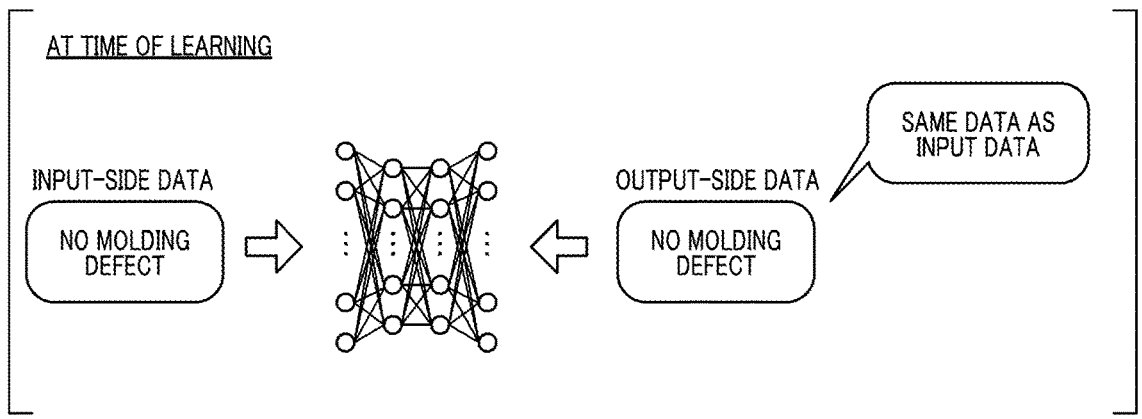
Figure 6B:
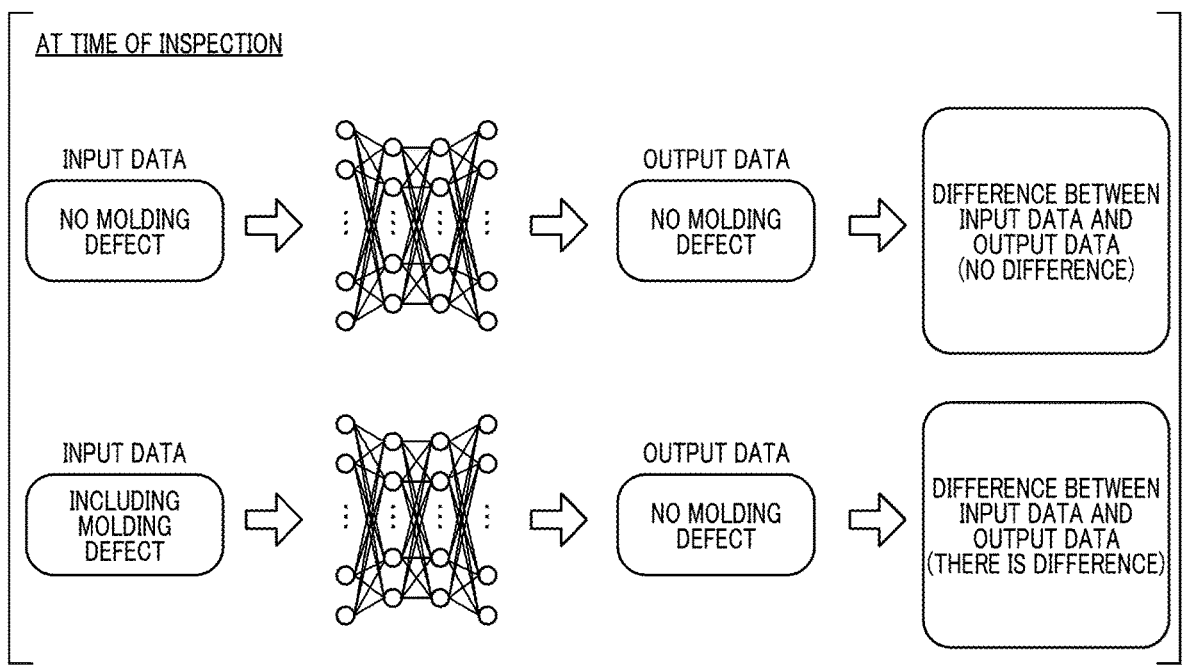

Next, a method of is a molding defect according to this embodiment will be described. In this embodiment, an auto encoder (AutoEncoder) that is one method of machine learning is used as a molding defect inspection method. (FIGS. 6A and 6B are diagrams illustrating an overview of an auto encoder. As illustrated in FIG. 6A, the auto encoder generates a machine learning model using only data (for example, images) at a normal time. When abnormal data (data including a part different from normal data) is input to a machine learning model that has learned a sufficient amount of data, as illustrated in FIG. 6B, data acquired by removing the abnormal part is output (estimated).

In this embodiment, a machine learning model is generated in advance using normal data having no molding defect (normal pattern images) as input data and training data. Then, in the inspection process, an image from which inspection (determination) for molding defects is to be performed is input to the machine learning model, and output data is acquired. As described above, if normal data (an image including no molding defect) is input, the same data as the input data is output as output data. On the other hand, if abnormal data (an image having a molding defect (effusion and non-filling)) is input, normal data (an image including no molding defect) estimated from input data is output as output data. Thus, as illustrated in FIG. 6B, a difference between input data (an input image) and output data (an output image) indicates a part of a molding defect, and presence/absence of a molding defect (effusion or non-filling) is inspected (determined) on the basis of presence/absence of such a difference.

Next, the molding defect inspection process will be described in more detail. It is assumed that, even when an image used for a molding defect inspection for effusion, non-filling, and the like is captured by any molding defect inspection device, the same result is acquired. For this reason, for example, as a machine learning model used for a molding defect inspection of the lithography system as illustrated in FIG. 2, a machine learning model that is commonly used by a plurality of molding defect inspection devices is generated (learned) and then, is input to each of the molding defect inspection devices through a network or the like. Then, the machine learning model is used by each of the molding defect inspection devices. When the imaging performances of a plurality of molding defect inspection devices are almost the same, by commonly using the same learning data, molding defect inspection accuracy between the plurality of molding defect inspection devices can be uniformed.

However, actually, if a different device is used, for example, an image acquired when a substrate is observed changes due to an individual difference of the device and a change over time, and there is a likelihood of molding defect inspection accuracy being degraded. In order to check necessity of readjustment due to degradation of molding defect inspection accuracy of each molding defect inspection device a visual image observation (determination) and the like need to be performed for an inspection result acquired by each molding defect inspection unit. In addition, if the molding defect inspection accuracy is degraded, for example, the molding defect inspection device needs to be readjusted through recalculation (relearning) of the machine learning model or the like. Operations for checking inspection accuracy of molding defect inspection and adjusting an inspection function need to be performed with manual intervention, and thus, a time may be required for checking and adjustment operations that are necessary for continuously operating the molding defect inspection device.

In order to solve the problems described above, this embodiment has a feature in which molding defect inspection accuracy is checked, and necessity/non-necessity of readjustment of the inspection function is determined on the basis of a result thereof. In description presented here, a reference substrate is a substrate for which a molding process has been performed at least in part and is a substrate that is used for checking (inspecting) accuracy of a molding defect: inspection. In other words, the reference substrate can be described as a substrate for checking. In this embodiment, as the reference substrate, a substrate in which a pattern of an imprint material is formed its at least a of the shot region is used. The pattern of imprinting material formed the reference substrate may be formed by a process performed by a certain imprinting device. Although, as the reference substrate, a substrate including no molding defect for which the imprinting process has been performed may be used, it is preferable to case a substrate including a molding defect for which the imprinting process has been performed. In addition, as the reference substrate, a substrate such as a semiconductor device that is in the middle of production of a product may be used.

Figure 7:
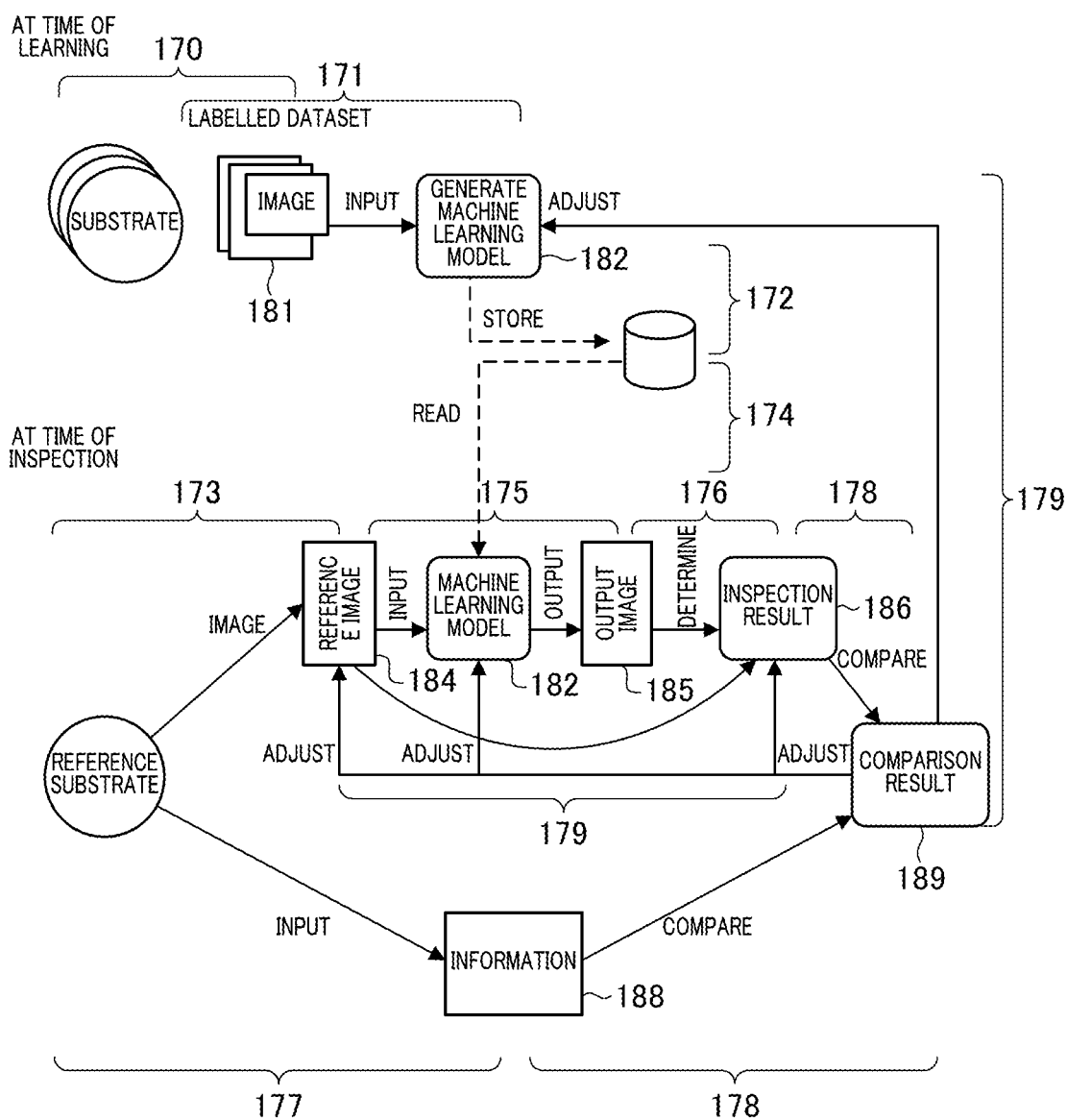
FIG. 7 is a diagram schematically illustrating a process of acquiring accuracy of inspection according to this embodiment.
Figure 8:
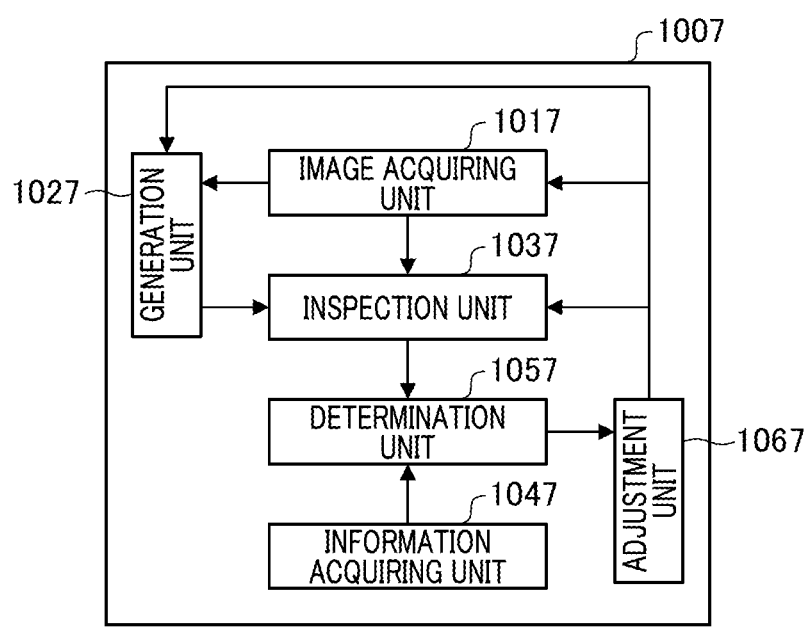
FIG. 8 is a schematic view illustrating the system configuration of a molding defect inspection device 1007.

FIG. 7 is a diagram schematically illustrating a process of acquiring accuracy of inspection according to this embodiment. As illustrated in FIG. 7, an inspection accuracy checking process according to this embodiment is largely divided into a process performed when chine learning model is generated (at the time of learning) and a process, which is performed when inspection accuracy is acquire (inspected), including a process of actually inspecting presence/absence of a molding defect. FIG. 8 is a schematic view illustrating the system configuration of the molding defect inspection device 1007. As described above, the molding defect inspection devices 1007 may be realized using the calculation mechanism 113 of the imprinting device 100 or the control device 1003 (using them in parallel). The molding defect inspection devices 1007 includes an image, acquiring unit 1017, a generation unit 1027, an inspection unit 1037, an information acquiring unit 1047, a determination unit 1057, and an adjustment unit 1067.

The image acquiring unit. 1017 realizes a function of acquiring an image of a peripheral part of a shot region (an area in which a pattern is to be formed) of a substrate. Although the image acquiring unit 1017 may include an imaging unit that images the substrate, it may be configured to acquire an image captured by an external imaging device. There are two types of images acquired by the image acquiring unit 1017. One type is an image that is used as training data used for generating a machine learning model. In this embodiment, as described above, an image used as training data is an image of a peripheral part of a shot region, in which a pattern is formed, including no molding defect. The other type is an image used for a molding defect inspection, other words, an image for inspection (an inspection target) (a detection image).

The generation unit 1027 realizes a function of generating a machine learning model used for an inspection process for inspecting presence/absence of a molding defect of a pattern in a substrate S using an image for training data input to the image acquiring unit 1017.

The inspection unit 1037 realizes a function of inputting an image, which is an inspection target input to the image acquiring unit 1017, to a machine learning model generated by the generation unit 1027 and acquiring an inspection result indicating presence: absence of a pattern formation defect. If the process of acquiring inspection accuracy is performed, by inputting an image of a peripheral part (a reference image) of a shot region (an area in which a pattern is to be formed) of the reference substrate to the image acquiring unit 1017, an inspection result of presence/absence of a formation defect of a pattern of the reference image is acquired. A machine learning model used by the inspection unit 1037 may be a machine learning model that is generated by an external device. In such a case, for example, the inspection unit 1037 acquires the machine learning model through a network or the like. In the case, a machine learning model acquiring unit used for acquiring (for example, downloading) a machine learning model from the outside of an information processing device is provided.

The information acquiring unit 1047 acquires information relating to a molding defect of the reference substrate. Here, the information relating to a molding defect of the reference substrate, for example, includes as least one, of (A) to (C) described below. In addition, if the reference substrate includes a molding defect, it is preferable to include at least one in (A). If (A) is not present in the information relating to a molding defect of the reference substrate, it indicates that the reference substrate does not include a molding defect.

(A) Molding defect information of a position at which a molding defect is present, a magnitude of a molding defect, a type of molding defect such as effusion and non-filling, and the like (B) Information of imaging conditions such as wavelength information, a light quantity, resolution, an imaging position, a bright field/a dark field, and the like at the time of imaging a reference image (C) Characteristic information of a reference image such as brightness, contrast, and the like of the reference image The information relating to a molding, defect of a reference substrate is acquired from a result of inspection of the referee ace substrate that is performed by at least one inspection device 1005 among an overlap inspection device, a CD inspection device, a defect inspection device, and an electric characteristic inspection device. In addition, the information relating to a molding defect of the reference substrate may be acquired from a result of inspection of an image, in which the reference substrate is imaged, through human's visual observation. Furthermore, if the molding defect inspection device 1007 has an input Unit such as a keyboard or a touch panel, the information relating to a molding defect of the reference substrate may be in input from an operation screen of the molding defect inspection device 1007 through the input unit. In addition, the information relating to a molding detect of the reference substrate may be acquired through the network 1002 or may be acquired through a portable medium such as a hard disk or a USB. The information relating to a molding defect may be regarded as information relating to a molding defect acquired from results of inspection that has been performed for the reference substrate in advance. In addition, the information relating to a molding defect may be regarded also as information of known molding defects relating to the reference substrate. Furthermore, the information relating to a molding defect may be regarded also as correct information relating to molding defects of the reference substrate.

The determination unit 1057 compares the inspection result of presence/absence of a molding defect of the reference substrate acquired by the inspection unit 1037 with the information relating to a molding defect of the reference substrate acquired by the information acquiring unit 1047. Then, the determination unit 1057 determines necessity/non-necessity of adjustment of the inspection function on the basis of a result of the comparison.

If the determination unit 1057 determines that the adjustment of the inspection function is necessary, the adjustment unit 1067 specifies a function to be adjusted among functions relating to the molding detect, inspection of the molding defect inspection device 1007 on the basis of the result of the comparison acquired by the determination unit 1057 and adjusts the specified function. In description presented here, the functions relating to a molding defect inspection include functions realized by the image acquiring unit 1017, the generation unit 1027, and the inspection unit 1037.

Figure 9:
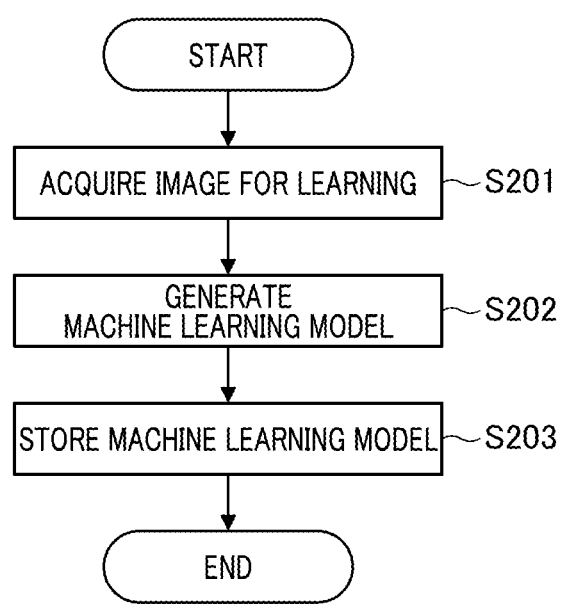
FIG. 9 is a flowchart illustrating a process performed when a machine learning model is generated.

First, a process performed at the time of generating a machine learning model will be described with reference to FIGS. 7 to 9. FIG. 9 is a flowchart illustrating a process performed when a machine learning model is generated in this embodiment. In the flowchart of FIG. 9, by performing Steps S201 to S203, a machine learning model is generated and stored.

In Step S201, the image acquiring unit 1017 acquires an image for learning. More specifically, the image acquiring unit 1017 acquires an image including a pattern obtained by imaging a substrate (an image for learning). The acquisition of an image for learning is performed for each of a plurality of substrates and for each shot region of such a substrate. It is preferable that there be many images for learning. S201 corresponds to a part 170 illustrated in FIG. 7.

In Step S202, the generation unit 1027 generates a machine learning model on the basis of a plurality of it acquired in Step S201. More specifically, by using the same image 181 as input data and output data (training data) of a neural network generated in advance, optimization of such a neural network is performed. In accordance with this, a machine learning model 182 (a neural network) is generated. S202 corresponds to a part 171 illustrated in FIG. 7.

In Step S203, the generation unit 1027 stores the generated machine teaming model 182. This step corresponds to a part 172 illustrated in FIG. 7.

Figure 10:
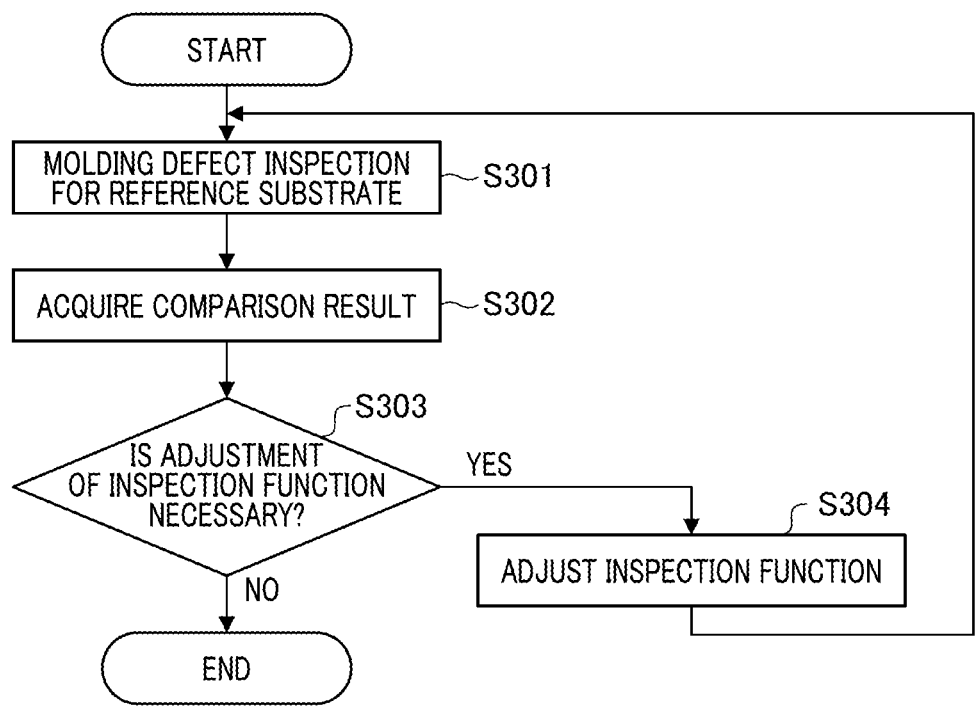
FIG. 10 is a flowchart illustrating a process performed when necessity/non-necessity of adjustment of an inspection function is determined.

Next, the process of determining necessity/non-necessity of adjustment of the inspection function will be described with reference to FIGS. 7, 8, and 10 to 13. FIG. 10 is a flowchart illustrating a process performed when necessity/non-necessity of adjustment of the inspection function is determined.

In Step S301, the inspection unit 1037 performs a molding defect inspection for the reference substrate. Details of this Step will be described below with reference to FIG. 11.

In Step S302, a result of the molding defect inspection for the reference substrate performed in Step S301 is compared with the information relating to a molding defect of the reference substrate acquired by the information acquiring unit 1047, and a result of the comparison is acquired. Details of this step will be described below with reference to FIG. 12.

In Step S303, the determination unit 1057 determines necessity/non-necessity of adjustment of the inspection function on the basis of the acquired result of the comparison. More specifically, if there is a difference between the result of the molding defect inspection for the reference substrate and the information relating to a molding defect of the reference substrate, in other words, if there is non-coincidence, the determination unit 1057 determines that there is false detection of molding defect and determines that adjustment of the inspection function is necessary. On the other hand, if there is no difference between the result of the molding defect inspection for the reference substrate and the information relating to a molding defect of the reference substrate acquired by the information acquiring unit 1047, in other words, if there is coincidence, the determination unit 1057 determines that there is no false detection of a molding defect and determines that adjustment of the inspection function is unnecessary. It can be regarded that, when a difference between the result of the molding defect inspection for the reference substrate and the information relating to a molding defect of the reference substrate acquired by the information acquiring unit 1047 becomes smaller, the inspection accuracy becomes higher. If it is determined that adjustment of the inspection function is necessary in Step S303 (Yes), the process is caused to proceed to Step S304. On the other hand, if it is determined that adjustment of the inspection function is unnecessary in Step S303 (No), the process of determining necessity/non-necessity of adjustment of the inspection function ends.

In Step S304, in order to improve the accuracy of a molding defect inspection by eliminating false detection of a molding defect, the inspection function is, adjusted on the basis of the result of the comparison acquired in Step S302. Details of this Step will be described with reference to FIG. 13.

In this embodiment, necessity/non-necessity of adjustment of the inspection function is determined on the basis of presence/absence of false detection in Step S303. However, inspection accuracy may be calculated on the basis of a difference between a result of a molding detect inspection for the reference substrate and the information relating to a molding defect of the reference substrate, and, if the inspection accuracy is equal to or lower than a threshold, adjustment of the inspection function may be determined as being necessary. If so, the determination unit 1057 functions as a calculation unit that calculates inspection accuracy.

Figure 11:
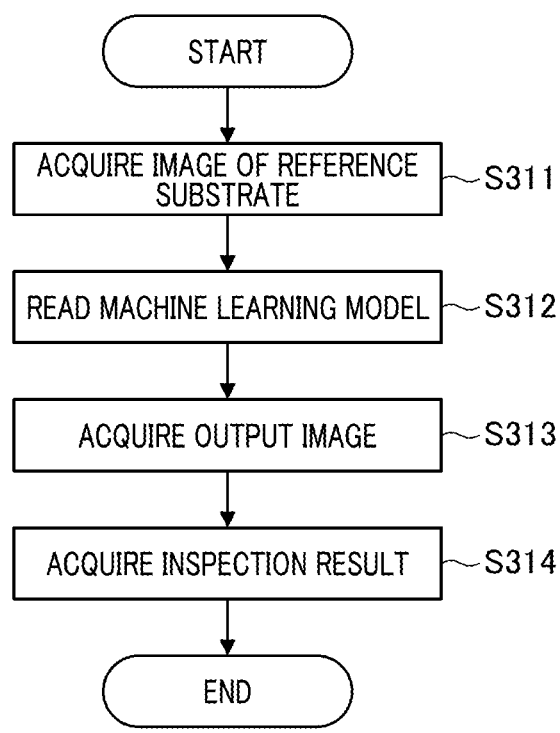
FIG. 11 is a flowchart illustrating a detailed process of Step S301 illustrated in FIG. 10.

FIG. 11 is a flowchart illustrating a detailed process of Step S301 illustrated in FIG. 10. In other words, FIG. 11 is a flowchart illustrating a molding defect inspection process for a reference substrate. In Step S311, the image acquiring unit 1017 acquires an image 184 of the reference substrate (the reference image). This step corresponds to a part 173 illustrated in FIG. 7.

In Step S312, the inspection unit 1037 reads the machine learning model 182 stored in Step S203. This step corresponds to a part 174 illustrated in FIG. 7. The machine learning model 182 may use a machine learning model calculated by at another molding defect inspection device.

In Step S313 the inspection unit 1037 inputs the image 184 acquired in Step S311 to the machine learning model 182 read in Step 312 and acquires an output image 185 (output data). This step corresponds to a part 175 illustrated in FIG. 7.

In Step S314, the inspection unit 1037 acquires a difference between the image 184, which is an inspection target, acquired in Step S311 and the output image of Step S313 and acquires an inspection result 186 of presence/absence of a molding defect on the basis of such a difference. For example, if the difference between the image 184 that is an inspection target and the output image 185 is larger than a threshold set in advance, an inspection result 186 indicating that there is a molding defect (effusion or non-filling) is acquired. On the other hand, if the difference between the image 184 that is an inspection target and the output image 185 is equal to or smaller than the threshold set in advance, an inspection result 186 indicating that there is no molding defect is acquired. This step corresponds to a part 176 illustrated in FIG. 7.

Figure 12:
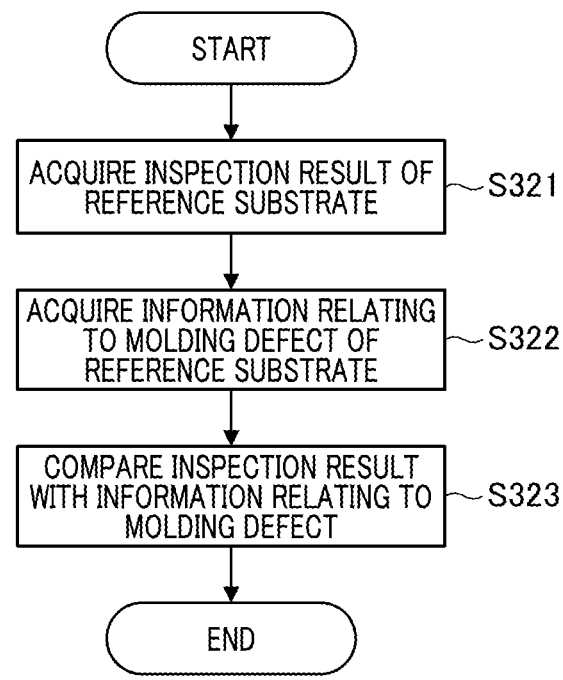
FIG. 12 is a flowchart illustrating a detailed process of Step S302 illustrated in FIG. 10.

FIG. 12 is a flowchart illustrating a detailed process of Step S302 illustrated in FIG. 10. In other words, FIG. 12 is a flowchart illustrating the process of comparing a result of a molding defect inspection for the reference substrate with the information relating to a molding defect of the reference substrate acquired b the information acquiring unit 1047, In Step S321, the determination unit 1057 acquires an inspection result of the reference substrate acquired in Step S314 illustrated in FIG. 11.

In Step S322, the determination unit 1057 acquires information 188 relating to a molding defect of the reference substrate from the information acquiring unit 1047, This step corresponds, to a part 177 illustrated in FIG. 7.

In Step S323, the determination unit 1057 compares the inspection result 186 of the reference substrate acquired in Step S321 with the information 188 relating to a molding defect of the reference substrate acquired in Step S322. Then, a comparison result 189 is acquired. This step corresponds to a part 178 illustrated in FIG. 7.

Figure 13:
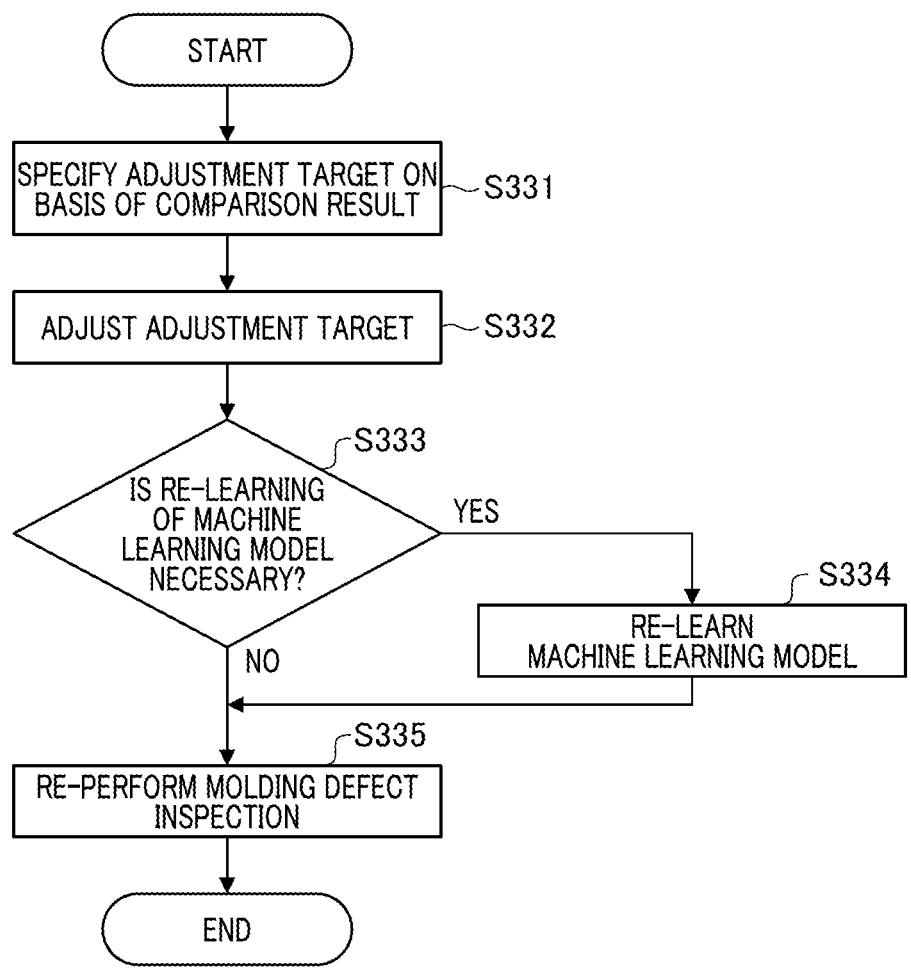
FIG. 13 is a flowchart illustrating a detailed process of Step S304 illustrated in FIG. 10.

FIG. 13 is a flowchart illustrating a detailed process of Step S304 illustrated in FIG. 10. In other words, FIG. 13 is a flowchart illustrating an inspection function adjustment process. In Step S331, the adjustment unit 1067 specifies a function to be adjusted among functions relating to a molding defect inspection of the molding defect inspection device 1007 on the basis of the comparison result 189. More specifically, a function to be adjusted among the image acquiring unlit 1017, the generation unit 1027, and the inspection unit 1037 that realize functions relating to a molding defect inspection is specified.

In Step S332, the adjustment unit 1067 outputs tin instruction for adjusting inspection conditions to the adjustment target specified in Step S331. Here, in the inspection conditions to be adjusted, imaging conditions for an inspection image acquired by the image, acquiring unit 1017 and a machine learning model, a threshold, and the like used by the inspection unit 1037 are included. In the imaging conditions for an inspection image, illumination light, a focus, a magnification, an area to be imaged, a unit configured to perform imaging, and the like at the time of imaging an inspection image are included. As specific examples of an adjustment target and an adjustment instruction, there are following.

(1) If the difference of an image, from which a molding defect has been erroneously detected, acquired in Step S314 is concentrated on the periphery of the threshold of Step S314, an instruction for adjusting the threshold is given to the inspection unit 1037.

(2) If the difference between the characteristic information of the reference image included in the information relating to a molding defect and characteristics such as contrast, brightness, and the like of an inspection image is larger than a predetermined threshold, the image acquiring unit 1017 is instructed to adjust a wavelength of illumination light at, the time of capturing the inspection image.

(3) If the difference between the characteristic information of the reference image included in the information relating to a molding defect and characteristics such as contrast, brightness, and the like of an inspection image is larger than a predetermined threshold, the image acquiring unit 1017 is instructed to adjust a light quantity of illumination light at the time of capturing the inspection image.

(4) If a similar machine learning model is present the outside thereof, the inspection unit 1037 is instructed to perform adjustment such that it reads the similar machine learning model in Step S312.

(5) Re-learning of the machine learning model is adjusted by adding an image captured by a molding defect inspection device that is an adjustment target to the generation unit 1027.

For example, at least one of illumination tight, a focus, a magnification, an area to be imaged, and a unit configured to perform imaging at the time of capturing an inspection image is included.

In Step S333, the adjustment unit 1067 determines whether or not re-learning of a machine learning model is necessary. More specifically, the adjustment unit 1067 checks whether re-learning of a machine learning model is included in the adjustment instruction of Step S332. If re-learning of a machine learning model is not included in the adjustment instruction, it is determined that the relearning of a machine learning model is unnecessary; and the process is caused to proceed to Step S335. On the other band, if re-learning of a machine learning model is included in the adjustment instruction, it is determined that the relearning of a machine learning model is necessary, and the process is caused to proceed to Step S334.

In Step S334, the re-learning of a machine learning model is performed. More specifically, the process described using FIG. 9 is re-executed with data being added or changed. In accordance with this, at least a part of the machine learning model is corrected (changed). The re-leaning of a machine learning model may be performed by another molding defect inspection device.

In Step S335, after performing adjustment of the inspection function, a molding defect inspection is performed again for the reference substrate for checking inspection accuracy. If a molding defect inspection for the reference substrate is performed again, it is preferable to perform from Step S311. Here, if the adjustment instruction of Step S332 has influence only on the functions relating to Steps S312 to S314, the process may be performed from a previous step thereof. Steps S331 to S335 correspond to a part 179 illustrated in FIG. 7.

In addition, in Step S332, by causing a display unit of the molding defect inspection device 1007 to display a user interface for selecting an adjustment target, an adjustment target may be selected on the basis of an instruction input by a user. FIGS. 14A, 14B, 14C, 15A, and 15B are schematic views illustrating screen examples of the user interface according to the first embodiment. FIG. 14A is a schematic view illustrating a screen example of the user interface for selecting a method for adjusting the molding defect inspection device 1007. Foot example, as illustrated in FIG. 14A, by displaying that false detection of a molding defect is present on the screen, it is notified to a user. Then, candidates for adjustment methods, in other words, inspection conditions to be adjusted are displayed on a display screen such that they can be selected by a user. In this user interface, a user can select no inspection function adjustment. At this time, a list 1401 of comparison results including detailed results of comparison between an inspection result of presence/absence of a molding defect of the reference substrate and the information relating to a molding defect of the reference substrate may be displayed.

FIG. 14B is a schematic view illustrating a screen example of a user interface for selecting a machine learning model to be used. For example, as illustrated in FIG. 14B, a user interface enabling a user to select a machine learning model to be used for a molding defect inspection from among a plurality of machine learning models may be displayed. At this time, for example, the plurality of machine learning models and inspection accuracy of each machine learning, model calculated by the determination unit 1057 are displayed in association with each other. In accordance with this, a user can intuitively perceive inspection accuracy of each machine learning model.

In addition, as illustrated in FIG. 14C, a user interface enabling a user to select re-learning/no re-learning of a machine learning model, if re-learning of a machine learning model is necessary, may be displayed.

Figure 15A:
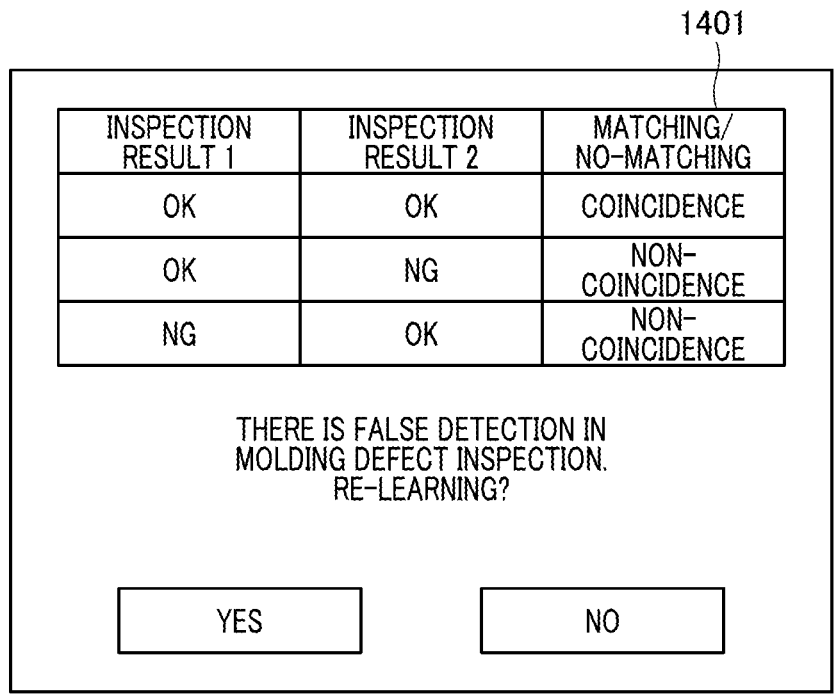
FIGS. 15A and 15B are schematic views illustrating an example of screens of the user interface according to the first embodiment.
Figure 15B:
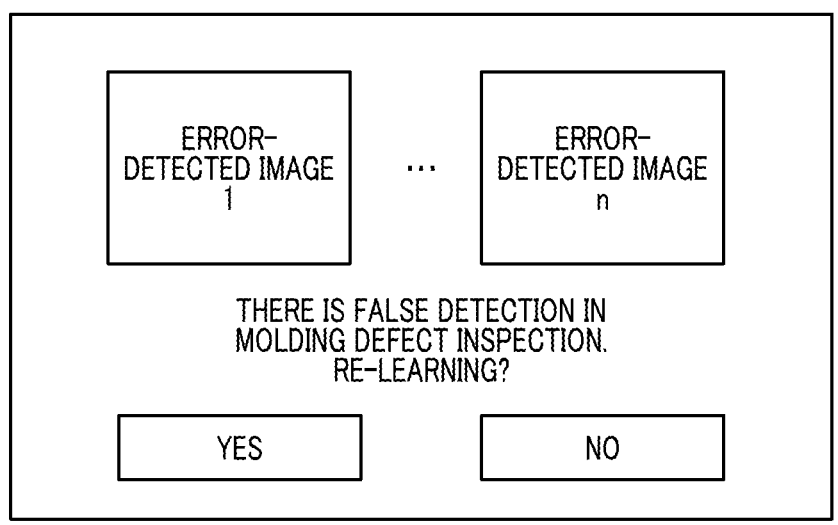

Furthermore, in the user interface, as illustrated in FIG. 15A, display enabling a user to select re-learning/no re-learning of a machine learning model may be displayed together with the list 1401 of the comparison results. In addition, in the user interface, as illustrated in FIG. 15B, an image having molding defect detection error may be displayed. By displaying such an image, user's visual checking can be easily performed as well.

As another embodiment, by comparing inspection accuracies of a plurality of molding defect inspection devices included in a lithography system, a molding defect inspection device having high inspection accuracy can be identified. In order to improve inspection accuracy of the lithography system, a molding defect inspection for a substrate, which is imprinting processed, can be performed using a molding defect inspection device having higher inspection accuracy as well. At this time, although it is preferable to use a molding defect inspection device having highest inspection accuracy among devices included in the lithography system for a molding defect inspection, a molding defect inspection device of which inspection accuracy exceeds a threshold may be used.

As above, the molding defect inspection device, the imprinting device, and the lithography system to which the information processing device according to this embodiment is applied have been described. According to this embodiment checking of inspection accuracy and adjustment of an inspection function can be efficiently realized for determining presence/absence of a molding defect of a pattern formed on a substrate in an imprinting device.

Second Embodiment

In a second embodiment, a flattening device performing a formation process (a flattening process) of forming a flattening layer on a substrate will be described as an example of a molding device. Matters not mentioned here may follow the embodiment described above.

In the embodiment described above, although a mold for transferring a circuit pattern in which an uneven pattern is provided has been described as the mold M, mold (a plane template) having a plane part having no uneven pattern may be used. A plane template is used by a flattening device (a molding device) that performs a flattening process of molding a composition on a substrate to be flattened using a plane part (a composition molding process). A flattening process includes a step of curing a curable composition using emission of light or heating in a state in which a flat part of a plane template is brought into contact with the curable composition supplied on a substrate.

Figure 16A:
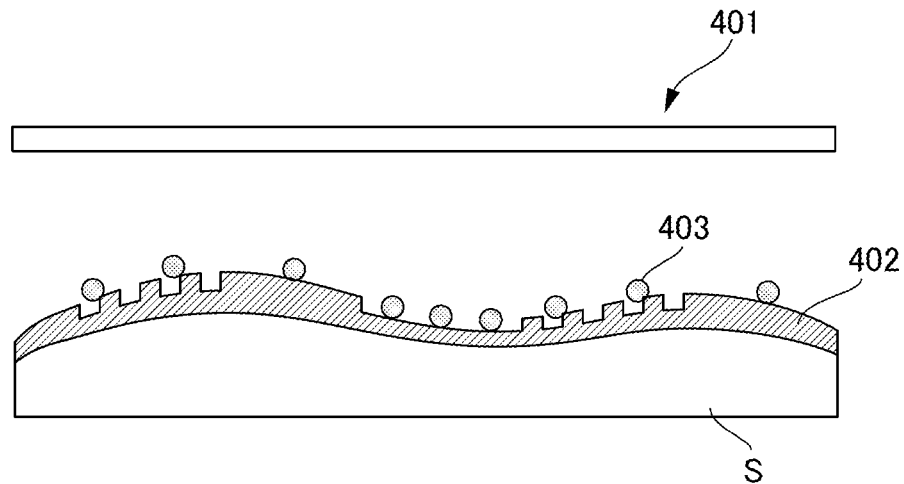
FIGS. 16A, to 16C are diagrams illustrating processes performed by a flattening device according to a second embodiment.
Figure 16B:
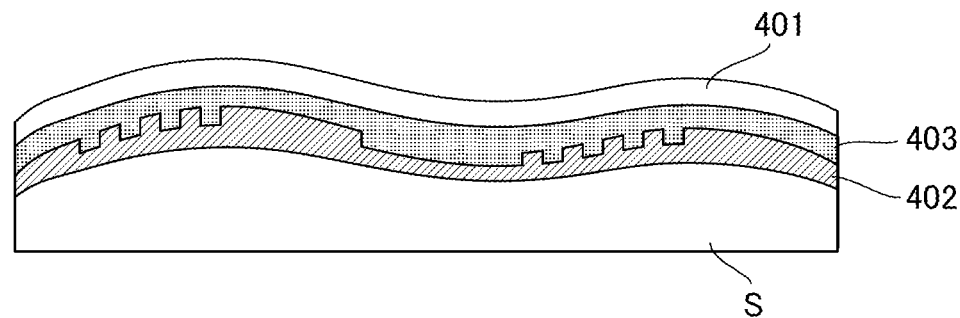
Figure 16C:
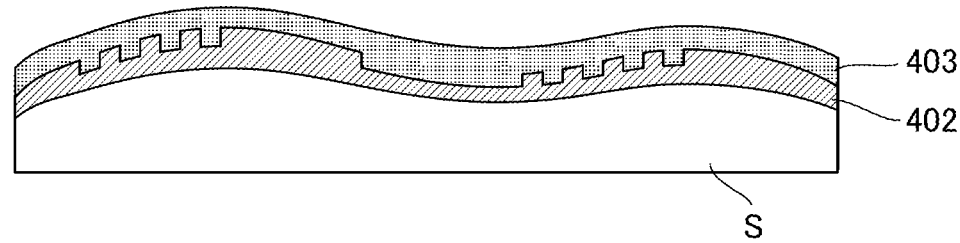

FIGS. 16A to 16C are diagrams illustrating processes performed by a flattening device according to the second embodiment, in the flattening device, a flattening layer is formed on a substrate S using a plane template. A base pattern 402 on the substrate has an unevenness profile due to a pattern formed in a previous step, and, particularly, in accordance with implementation of a multi-layer structure of recent memory elements, there is also a process substrate having a level difference of about 100 nm. A level difference due to gentle winding of the entire substrate can be corrected using a focus following function of a scanning/exposure device that is used in a photo step. However, fine unevenness of a pitch entering inside an exposure slit area of an exposure device consumes a depth of focus (DOF) of the exposure device. As conventional techniques for smoothing the base pattern 402 of the substrate, techniques forming a flattening layer such as spin on carbon (SOC) or chemical mechanical polishing (CMP) are used. However, conventional techniques have a problem in that sufficient flattening performance cannot be acquired, and unevenness differences of bases according to implementation of multiple layers tend to further increase from now on.

In order to solve this problem, the flattening device according to this embodiment performs local planarization inside a substrate face by pressing a plane template (a plane plate) to an uncured composition with which a substrate has been coated in advance. In this embodiment, the configuration of the flattening device may be similar to that of the imprinting device 100 illustrated in FIG. 1 as a whole. However, in the flattening device, instead of the mold M having a pattern part in which an uneven pattern is formed, a plane plate 401 having an area that is the same as or larger than the substrate S is brought into contact with the entire face of a composition layer on the substrate S. A mold holding part is configured to maintain such a plane plate.

FIG. 16A is a diagram illustrating a state in which a composition is supplied on a substrate before the plane plate 401 is brought into contact therewith. A supply pattern of this composition is calculated with unevenness information of the entire face of the substrate taken into account. FIG. 16B illustrates a state in which the plane plate 401 is brought into contact with the composition 403 on the substrate. FIG. 16C illustrates a state in which, after the composition 403 is cured by emitting light to the composition 403, the plane plate 401 is separated.

As described above, an actual substrate has not only a level difference of a pattern but also unevenness on the entire face of the substrate, and thus a timing art which the plane plate 401 is brought into contact with the composition 403 is different in accordance with the influence of the unevenness. In this embodiment, at a position at which a contact is de first, while movement of the composition starts immediately after the contact, the composition is disposed much in accordance with a degree thereof. In addition, at a position at which a contact is made last, while the start of movement of the composition, is late, and compositions flowing in from the periphery are added, the amount of the composition is decreased in accordance with a degree thereof. In accordance with such handling, a flattening layer having a uniform thickness on the entire face of the substrate can be formed. In addition, in this embodiment, although a case in which the flattening process is performed for the entire face of the substrate S, which is a processing target, altogether has been described, to flattening process may be performed for each shot region of the substrate S.

The invention according to the embodiment described above can be similarly applied to the flattening device according to this embodiment. In this embodiment, after a flattening process is performed, an image of a substrate or a shot region (an area in which a flattening layer is to be formed) and a peripheral part thereof, for which the flattening, process has been performed, is acquired, and effusion and non-filling (molding defects due to them) are inspected (detected) using such an image. In this embodiment, a substrate for a flattening process has been performed at least in a part is used as the reference substrate.

<Embodiment of Product Manufacturing Method>

A pattern of a cured material that is formed using the imprinting device is perpetually used at least in parts of various products or is temporarily used when various products are manufactured. Here, a product is an electric circuit element, an optical element, a MEMS, a recording element, a sensor, a mold, or the like. Examples of the electric circuit element include a volatile or nonvolatile semiconductor memory such as a DRAM, an SRAM, a flash memory, or an MRAM, a semiconductor element such as an LSI, a CCD, an image sensor, or an IPGA, and the like. Examples of the mold include a mold for imprinting and the like.

A pattern of a cured material is used directly as a constituent member of at least a part of the product described above or is temporarily used as a resist mask. In a step of processing a substrate, after etching, ion injection, and the like are performed the resist mask is removed.

Figure 17A:
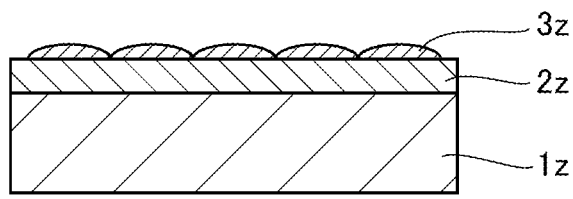
FIGS. 17A to 17F are diagrams illustrating a method for manufacturing a product.
Figure 17B:
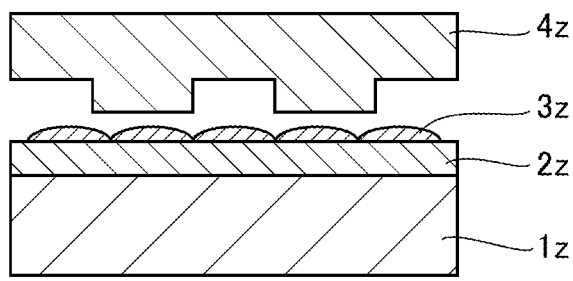

Next, a specific method for manufacturing a product will be described. As illustrated in FIG. 17A, a substrate 1z such as a silicon wafer in which a processing material 27 such as an insulator is formed on the surface is prepared, and subsequently, a composition 3z is applied to the surface of the processing material 2z using an ink jet method or the like. Here, an appearance it which the composition 3z having a shape of a plurality of droplets is applied on the substrate as illustrated.

Figure 17C:
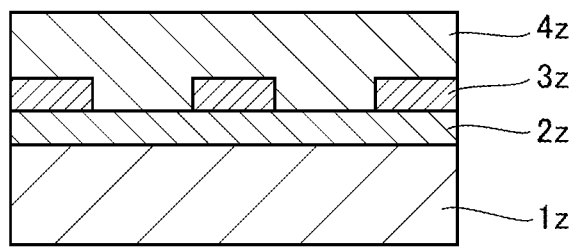
Figure 17D:
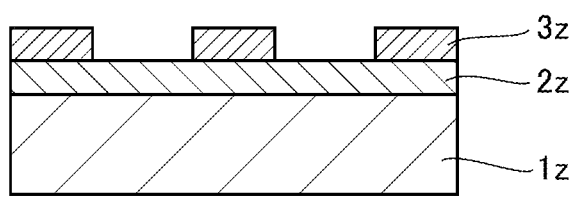

As illustrated in FIG. 17D, a mold 4z for imprinting is disposed such that a side on which the uneven pattern is formed is caused to face the composition 37 on the substrate. As illustrated in FIG. 17C, the substrate z to which the composition 3z is applied and the mold 4z are brought into contact with each other, and pressure is applied thereto. The composition 37 is filled in a gap between the mold 4z and the processing material 2z. When light as energy for curing is emitted with being transmitted through the mold 4z in this state, the composition 3z is cured.

As illustrated in FIG. 17D, when the told 4z and the substrate 1z are separated from each other after the composition 37 is cured, a pattern of a cured material of the composition 3z is formed on the substrate 1z. The pane of this cured material has a shape in which a concave part of the mold corresponds to a convex part of the cured material, and a convex part of the mold corresponds to a concave part of the cured material, in other words, the uneven pattern of the mold 4z is transferred to the composition 3z.

Figure 17E:
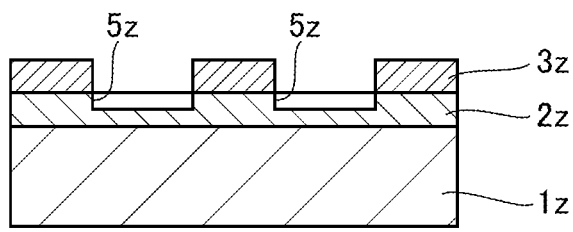
Figure 17F:
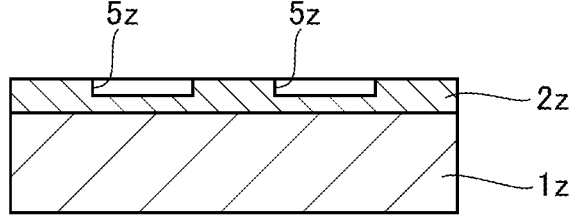

As illustrated in FIG. 17E, when etching is performed using the pattern of the cured material as an etching resistant mask, a part of the surface of the processing material 2z in which there is no cured material, or the cured material remains thin is removed to form a groove 5z. As illustrated in FIG. 17F, when the pattern of the cured material is removed, a product in which the groove 5z is formed on the surface of the processing material 2z can be acquired, Here, although the pattern of the cured material is removed, the pattern may not be removed also after processing and, for example, and may be used as an interlayer insulating film included in a semiconductor element or the like, in other words, a constituent member of the product. In addition, although an example in which the mold for transferring a circuit pattern having an uneven pattern is used as the mold 4z has been described, a mold (a plane template) that has a plane part having no uneven pattern may be used.

Other Embodiments

As above, although preferred embodiments of the present invention have been described, the present invention is not limited to such embodiments, and various alterations and changes can be made within the range of the concept thereof.

Embodiments of the present invention can also be realized by a computer of a system or apparatus that reads out and executes computer executable instructions (e.g., one or mote programs) recorded on a storage medium (which may also be referred to more fully as a 'non-transitory computer-readable storage medium') to perform the functions of one or more of the above-described embodiments and/or that includes one or more circuits (e.g., application specific integrated circuit. (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc. (DVD), or Blu-ray Disc (BD)), a flash memory device, a memory card, and the like.

This application claims the benefit of Japanese Patent Application No. 2020-121136, filed Jul. 15, 2020, which is hereby incorporated by reference wherein in its entirety.

What is claimed is:

1. An information processing device for determining necessity/non-necessity of adjusting inspection conditions for performing an inspection for molding defects of a molded composition on a substrate performed with a molding process of molding the composition on the substrate using a mold, the information processing device comprising:
a memory storing instructions; and
at least one processor that implements the instructions to:
acquire an image of the molded composition on a reference substrate already performed with the molding process and that includes a known molding defect by capturing the reference substrate;
inspect the acquired image using a learned machine learning model for the molding defects in the molded composition;
compare an inspection result of the inspection with information relating to the known molding defect of the reference substrate; and
determine the necessity/non-necessity of adjusting the inspection conditions of the learned machine learning model based on a comparison result of the comparison.

2. The information processing device according to claim 1, wherein the at least one processor determines that the adjustment of the inspection conditions is necessary in a state where the comparison result includes false detection of the molding defects of the molded composition.

3. The information processing device according to claim 2, wherein the at least one processor determines the false detection of the molding defects of the molded composition in a state where a difference exists between the inspection result and the information relating to the known molding defect of the reference substrate.

4. The information processing device according to claim 1, wherein:
the at least one processor adjusts the inspection conditions in a state where adjusting the inspection conditions is determined to be necessary, and
the inspection conditions include at least one of imaging conditions of the acquired image or the learned machine learning model.

5. The information processing device according to claim 4, wherein the at least one processor changes the learned machine learning model to another learned machine learning model, modifies part of the learned machine learning model, or changes a threshold used, in a state where a molding defect is detected after adjusting the learned machine learning model.

6. The information processing device according to claim 4, wherein the at least one processor changes at least one of illumination light, a focus, a magnification, an area to be imaged, or imaging at the time of capturing the image, in the state where adjusting the inspection conditions is determined to be necessary.

7. The information processing device according to claim 4, wherein the at least one processor causes a display device to display candidates of the inspection conditions to be adjusted to be selectable based on the comparison result and adjusts the selected inspection condition.

8. The information processing device according to claim 4, wherein the at least one processor:
calculates accuracy of the inspection based on the comparison result; and
causes a display device to display the learned machine learning model used in the inspection and inspection accuracy in association with each other.

9. The information processing device according to claim 1, wherein the molding defects include at least one of effusion of the composition or non-filling of the composition.

10. The information processing device according to claim 1, wherein the information relating to the known molding defect of the reference substrate includes at least one of a position at which the molding defect is present, a magnitude of the molding defect, a type of the molding defect, a wavelength or a light quantity of light illuminating the reference substrate, an imaging position, a bright field/a dark field, resolution, brightness of the image, or contrast of the image at the time of imaging the reference substrate.

11. The information processing device according to claim 1, further comprising an input unit configured to input the information relating to the known molding defect of the reference substrate.

12. The information processing device according to claim 1, wherein the known molding defect includes at least a molding defect among the molding defects of the molded composition.

13. The information processing device according to claim 1, wherein the at least one processor generates the learned machine learning model used during the inspection based on a plurality of images.

14. The information processing device according to claim 1, the at least one processor acquires the learned machine learning model from an external apparatus.

15. The information processing device according to claim 1, wherein the learned machine learning model is generated using an image including no molding defect among a plurality of images of the molded composition on the substrate as training data.

16. The information processing device according to claim 1, wherein the at least one processor inputs the image to the learned machine learning model and performs the inspection of the molding defects of the molded composition based on a difference between output data and the input image.

17. A determination method for determining necessity/non-necessity of adjusting inspection conditions for performing an inspection for molding defects of a molded composition on a substrate performed with a molding process of molding the composition on the substrate using a mold, the determination method comprising:
acquiring an image of the molded composition on a reference substrate already performed with the molding process and that includes a known molding defect by capturing the reference substrate;
inspecting the acquired image using a learned machine learning model for the molding defects in the molded composition;
comparing an inspection result of the inspection with information relating to the known molding defect of the reference substrate; and
determining the necessity/non-necessity of adjusting the inspection conditions of the learned machine learning model based on a comparing result of the comparison.

18. A molding defect inspection device comprising:
an optical member through which an image of a molded composition on a substrate is captured; and
an information processing device for determining necessity/non-necessity of adjusting inspection conditions for performing an inspection for molding defects of the molded composition on the substrate performed with a molding process of molding the composition on the substrate using a mold, wherein the information processing device includes:
a memory storing instructions; and
at least one processor that implements the instructions to:
acquire an image of the molded composition on a reference substrate already performed with the molding process and that includes a known molding defect by capturing the reference substrate;
inspect the acquired image using a learned machine learning model for the molding defects in the molded composition;
compare an inspection result of the inspection with the information relating to the known molding defect of the reference substrate; and
determine the necessity/non-necessity of adjusting the inspection conditions of the learned machine learning model based on a comparison result of the comparison.

19. A molding device for molding a composition on a substrate comprising:
a mold; and
a molding defect inspection device comprising:
an optical member through which an image of the molded composition on the substrate is captured; and
an information processing device for determining necessity/non-necessity of adjusting inspection conditions for performing an inspection for molding defects of the molded composition on the substrate performed with a molding process of molding the composition on the substrate using the mold, and wherein the information processing device includes:
a memory storing instructions; and
at least one processor that implements the instructions to:
acquire an image of the molded composition on a reference substrate already performed with the molding process and that includes a known molding defect by capturing the reference substrate;
inspect the acquired image using a learned machine learning model for the molding defects in the molded composition;
compare an inspection result of the inspection with information relating to the known molding defect of the reference substrate; and
determine the necessity/non-necessity of adjusting the inspection conditions of the learned machine learning model based on a comparison result of the comparison.

20. The molding device according to claim 19, wherein the mold:
forms a pattern of the composition by bringing the mold that includes the pattern into contact with the composition; or
includes a plane part that flattens the composition by bringing the plane part of the mold into contact with the composition.

21. A method of manufacturing a product, the method comprising:
molding a composition on a substrate using a molding device that molds the composition on the substrate using a mold;
performing inspection for molding defects in the molded composition on the substrate;
processing the substrate with the molded composition;
manufacturing the product from the processed substrate, wherein the molding device includes a molding defect inspection device including:
an optical element through which an image of the molded composition on the substrate is captured; and
an information processing device for determining necessity/non-necessity of adjusting inspection conditions for performing the inspection for the molding defects of the molded composition on the substrate performed with the molding, wherein the information processing device includes:
a memory storing instructions; and
at least one processor that implements the instructions to:
acquire an image of the molded composition on a reference substrate already performed with the molding and that includes a known molding defect by capturing the reference substrate;
inspect the acquired image using a learned machine learning model for the molding defects in the molded composition;
compare an inspection result of the inspection with information relating to the known molding defect of the reference substrate; and
determine the necessity/non-necessity of adjusting the inspection conditions of the learned machine learning model based on a comparison result of the comparison.

22. A non-transitory computer-readable storage medium storing a program executable by a computer to execute a method of determining necessity/non-necessity of adjusting inspection conditions for performing an inspection for molding defects of a molded composition on a substrate performed with a molding process of molding the composition on the substrate using a mold, the method comprising:
acquiring an image of the molded composition on a reference substrate already performed with the molding process and that includes a known molding defect by capturing the reference substrate;
inspecting the acquired image using a learned machine learning model for the molding defects in the molded composition;
comparing an inspection result of the inspection with information relating to the known molding defect of the reference substrate; and
determining the necessity/non-necessity of adjusting the inspection conditions of the learned machine learning model based on a comparison result of the comparison.

* * * * *